United States Patent
Miyagawa (10) Patent No.: US 7,659,481 B2
(45) Date of Patent: Feb. 9, 2010

(54) PRINTED WIRING BOARD AND INFORMATION PROCESSING DEVICE INCORPORATING THE BOARD

(75) Inventor: Shigenori Miyagawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 11/241,925

(22) Filed: Oct. 4, 2005

(65) Prior Publication Data

US 2006/0082001 A1 Apr. 20, 2006

(30) Foreign Application Priority Data

Oct. 15, 2004 (JP) .............................. 2004-302000

(51) Int. Cl.
*H01R 12/04* (2006.01)
*H05K 1/11* (2006.01)
(52) U.S. Cl. ....................................... 174/261; 174/262
(58) Field of Classification Search .................. 174/255, 174/262, 261
See application file for complete search history.

(56) References Cited

U.S. PATENT DOCUMENTS

| | | | | |
|---|---|---|---|---|
| 5,280,139 A | * | 1/1994 | Suppelsa et al. | ............. 174/260 |
| 5,484,963 A | * | 1/1996 | Washino | ...................... 174/261 |
| 5,784,262 A | * | 7/1998 | Sherman | ...................... 361/777 |
| 6,086,386 A | * | 7/2000 | Fjelstad et al. | ................ 439/70 |
| 6,225,686 B1 | * | 5/2001 | Matsuura | ..................... 257/668 |
| 6,443,739 B1 | * | 9/2002 | Currie | ......................... 439/55 |
| 7,158,387 B2 | * | 1/2007 | Terada et al. | ................ 361/784 |

FOREIGN PATENT DOCUMENTS

| | | |
|---|---|---|
| JP | 2000-261110 | 9/2000 |
| JP | 2001-68594 | 3/2001 |
| JP | 2002-329812 | 11/2002 |

\* cited by examiner

*Primary Examiner*—Ishwar (I. B.) Patel
(74) *Attorney, Agent, or Firm*—Finnegan, Henderson, Farabow, Garrett & Dunner, L.L.P.

(57) ABSTRACT

A printed wiring board mounted with a BGA package including pads, through holes and leads. The leads are linearly formed with almost the same width as the diameter of each of the pads and through holes and thus have high bonding strength against their peeling against an external force. The pads are provided at an angle of approximately 45 degrees outwardly relative to the through holes and along almost in the direction of application of thermal stress, and thus have high durability against their peeling due to an external force.

15 Claims, 6 Drawing Sheets

PRINTED WIRING BOARD AND INFORMATION PROCESSING DEVICE INCORPORATING THE BOARD

CROSS-REFERENCE TO RELATED APPLICATIONS

This application is based upon and claims the benefit of priority from prior Japanese Patent Application No. 2004-302000, filed Oct. 15, 2004, the entire contents of which are incorporated herein by reference.

BACKGROUND

1. Field

The present invention relates to a printed wiring board mounted with a ball grid array (BGA) package or the like and an information processing device incorporating the printed wiring board.

2. Description of the Related Art

Conventionally, a printed wiring board implemented in a portable notebook personal computer (hereinafter referred to as a note PC) has been reinforced differently and various measures have been taken against the peeling and disconnection of electrodes (pads) caused by stress (warp) due to an external shock and heat when the note PC is carried by a user.

Figure 8:
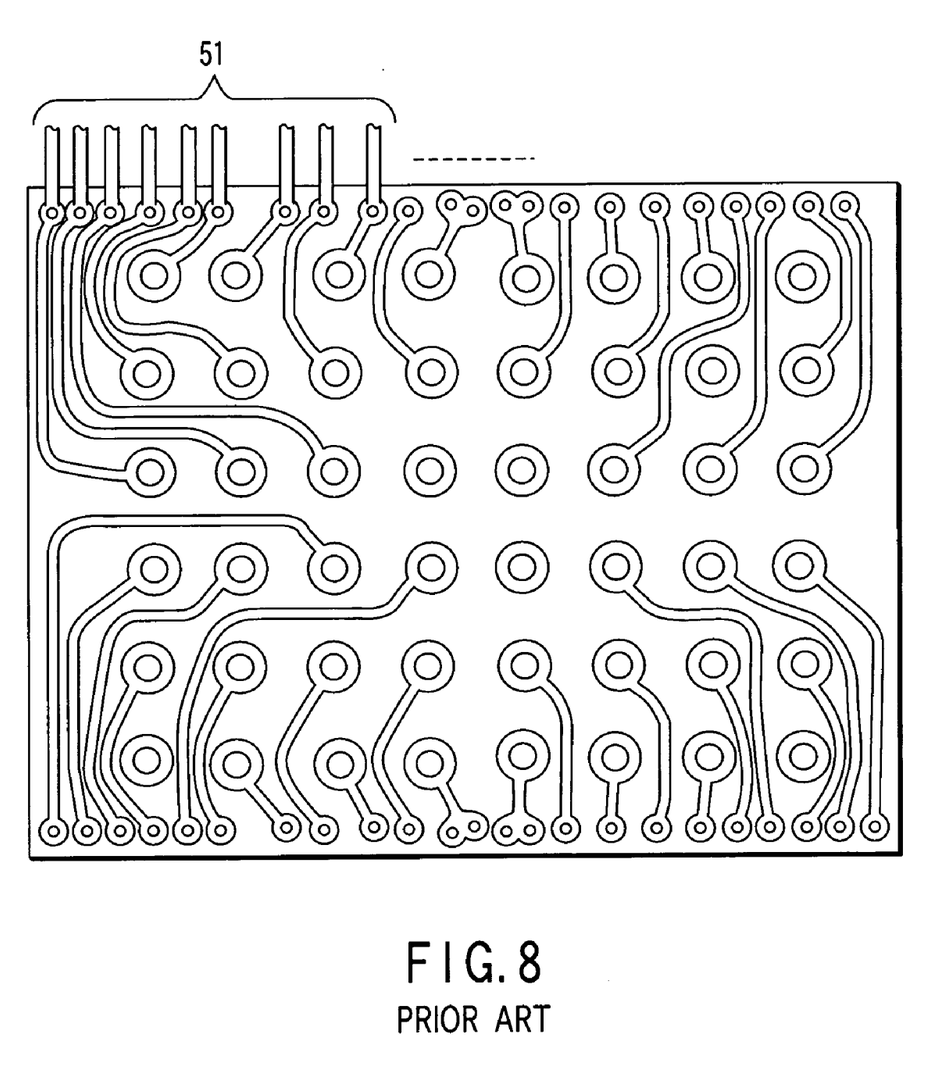
FIG. 8 is a diagram showing an example of a prior art printed wiring board mounted with a ball grid array (BGA) package.

A printed wiring board mounted with a ball grid array (BGA) package as shown in FIG. 8 is known. In this board, leads 51 are drawn out of the outermost pads of the BGA package at right angles to each side of the BGA package. The leads of the inner pads have a normal width and are routed in random directions. The surface leads of the inner pads are routed to pass between the outermost pads.

When an external force is applied in which direction the BGA package peels off the printed wiring board, it concentrates on the pads in the four corners of the board. The BAG package is therefore likely to start peeling off the four corners of the board. To prevent this, the pads in the four corners are increased in number and formed as reinforcing pads which expand outside the package or which are not angular but circular to increase in their resistance to peeling, as disclosed in Jpn. Pat. Appln. KOKAI Publication No. 2001-068594.

As lead-free materials are adopted for bumps (solder balls) in use for environmental protection, the solder balls decrease in viscosity. Therefore, the inner pads as well as the pads in the four corners of the board and their adjacent pads are peeled off or cracked by an external shock and thus electrically disconnected easily.

The BGA package increases in size in accordance with recent high degree of integration, whereas the solder balls (bumps) decrease in diameter and their pitches become narrow. In order to reduce a note PC in size and weight, the requirements to thin the printed wiring board and implement it at high density is increasing. Accordingly, the printed wiring board is warped and vibrated more easily and stress is applied to the BGA package mounted on the board more greatly than conventional.

In contrast, Jpn. Pat. Appln. KOKAI Publication No. 2000-261110 discloses a technique of drawing leads in radial directions from the center of a transformation portion within a board such that the board in its entirety can increase in bonding strength without increasing the size of electrode pads. Since the leads are drawn in the radial directions, the bonding strength is increased against a heat stress generated in the radial directions. However, the Publication No. 2000-261110 has to take into consideration a relationship in the actual wiring in the BGA package and the directions of the leads. It is very difficult to design the leads as disclosed in the Publication for each BGA package. Even though such leads can be achieved, they require time and effort and thus they are not cost-justified.

DETAILED DESCRIPTION

Embodiments of the present invention will be described in detail with reference to the accompanying drawings.

Figure 1:
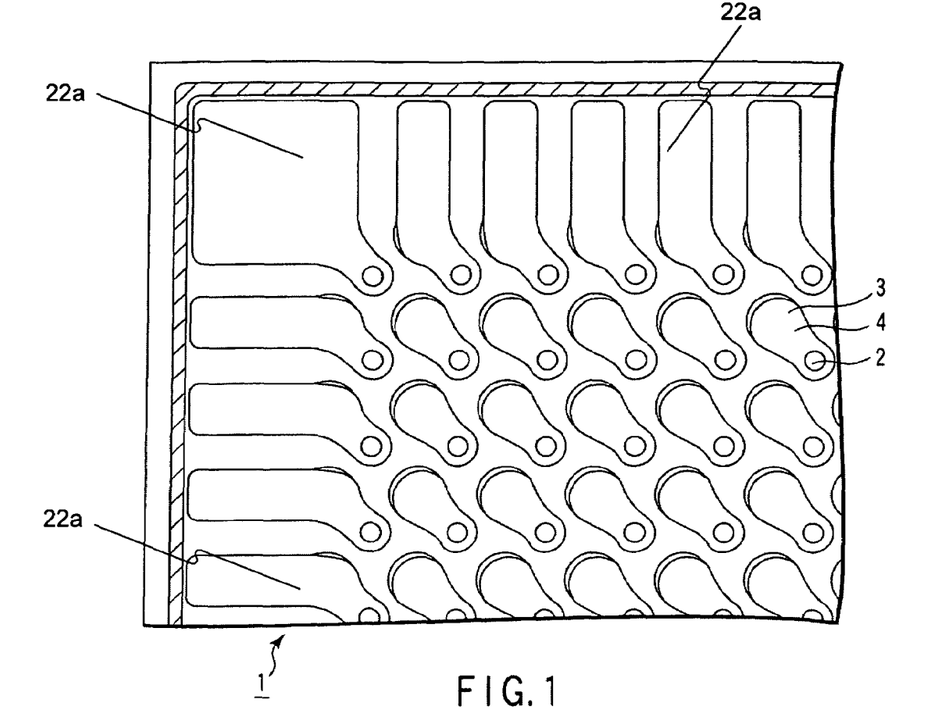
FIG. 1 is a diagram showing a wiring pattern of a printed wiring board according to a first embodiment of the present invention.
Figure 2:
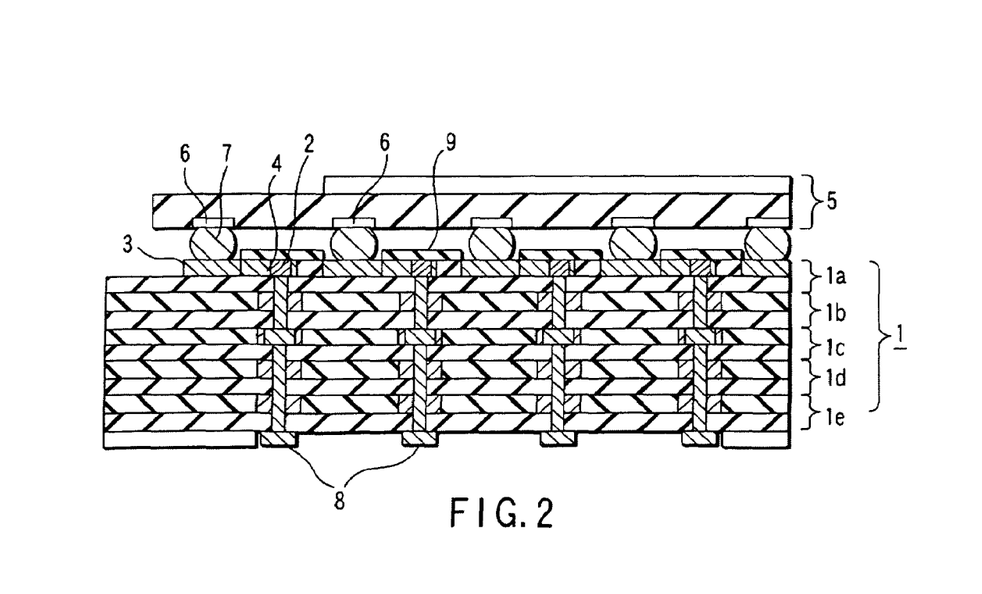
FIG. 2 is a sectional view of the printed wiring board according to the first embodiment of the present invention.
Figure 3A:
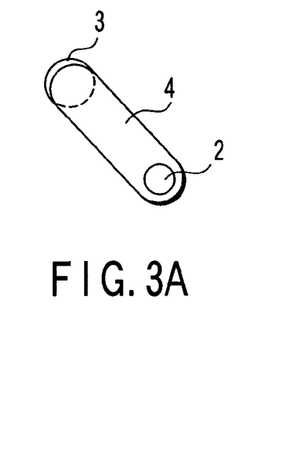
FIGS. 3A, 3B and 3C are sketches each showing a lead formed on the printed wiring board according to the first embodiment of the present invention.
Figure 3B:
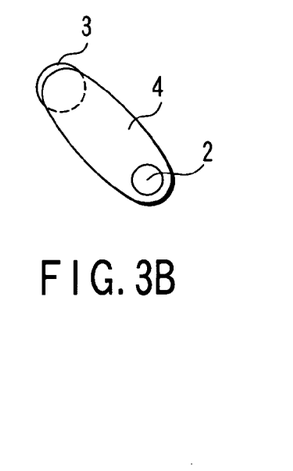
Figure 3C:
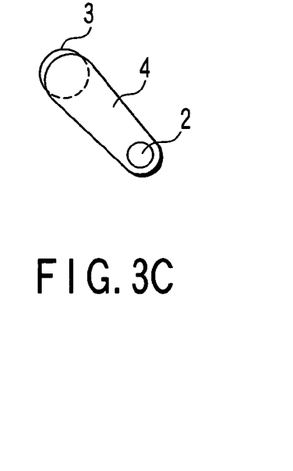

FIG. 1 shows a wiring pattern of a printed wiring board according to a first embodiment of the present invention. FIG. 2 shows a section of the printed wiring board mounted with a BGA package. FIGS. 3A, 3B and 3C each show a lead formed on the printed wiring board.

A printed wiring board 1 according to the first embodiment is applied to a multilayer wiring board and includes wiring boards 1a to 1e that are stacked one on another. The board 1 also includes through holes 2 for electrically connecting the wiring boards 1a to 1e, pads (electrodes) 3 provided at an angle of approximately 45 degrees toward the outer circumference of the board 1 from the through holes 2, and leads 4 for electrically connecting the through holes 2 and pads 3 to each other. The leads 4 are each formed linearly with almost the same width as the diameter (width) of each of the pads 3. The pads 3 are electrically connected to electrodes 6 of a BGA package (chip) 5 with solder balls (bumps) 7 interposed therebetween. In actuality, the location of the pads 3 depends on that of the electrodes 6 of the BGA package 5. The through holes 2 are therefore formed inwardly relative to the pads 3.

FIG. 3A shows one lead 4 having a width that is almost equal to the diameter of a circular pad 3, and FIG. 3B shows another lead 4 having a width that is slightly greater than the diameter of the pad 3. If the diameter of the circular pad 3 is considerably larger than that of each of the through holes 2 shown in FIG. 1, the width of a lead 4 can be reduced to the diameter of a through hole 2 from that of a pad 3 as shown in FIG. 3C. If the width of the lead 4 is approximate to the diameter of the pad 3, it can be set to a value for which an impedance is taken into consideration.

The first embodiment is directed to the leads for connecting the through holes 2 serving as first electrodes and the pads 3 serving as second electrodes. Needless to say, the leads can be used to connect the through holes or connect the pads.

As illustrated in FIG. 2, the inner wall of each of through holes 2 of wiring boards 1a to 1e is coated with a metal film, and a terminal 8 is provided through each of the through holes 2. The terminal 8 contacts the metal film, or a gap between each of the through holes 2 and the terminal 8 is filled with conductive materials, with the result that the through holes 2 are electrically connected to one another.

The wiring boards 1a to 1e are each constituted of an insulating material and a wiring pattern (conductor) including electrodes (pads 3). A resist film 9 is formed on each of the leads 4 to prevent a short circuit from occurring in the wiring pattern due to solders scattered when the pads 3 and electrodes 6 are bonded to each other by the solder balls 7. In the first embodiment, the solder balls 7 can be replaced with a lead-free material as a connecting one.

In the wiring pattern so formed, the leads 4 are arranged at an angle of approximately 45 degrees to each side of the rectangular wiring board. In FIG. 1, all the leads 4 are formed to rise from right to left. Needless to say, they can be formed to rise from left to right at an angle of approximately 45 degrees. If most of the leads are drawn toward the corners of the wiring board, the remaining leads can be formed to cross them at right angles in view of the surroundings of the leads. For example, in FIG. 1, if most of leads rise from right to left, the remaining leads can rise from left to right.

The outermost pads are formed larger than the inner pads such that they can increase in bonding area as reinforcing pads 22a and 22b. It is particularly desirable to increase the area of the pad in each corner of the board since a great stress is applied thereto. Not all of the outermost pads need to increase in area depending on the size of the BGA package, but only two or three pads in each corner of the board may increase in area. The reinforcing pads can be provided appropriately in accordance with their design. The bonding strength between the pads 3 and reinforcing pads 22a and 22b depends on the insulating materials of the wiring boards 1a to 1e. The peel strength of solder balls on the BGA package side and that of pads and reinforcing pads on the printed wiring board side have only to be almost equal to each other, and the shape and number of pads have only to be satisfied taking into consideration the direction of stress to be applied to the wiring board.

In the wiring pattern so formed, the leads 4 are formed linearly with almost the same width as the diameter of each of the pads 3 and through holes 2. The pads therefore have a high bonding strength against their peeling due to an external force. Furthermore, the pads 3 are provided at an angle of approximately 45 degrees toward the outer circumference of the board from the through holes 2 and thus arranged almost in the direction of the application of a thermal stress. The pads therefore have high durability against their peeling due to an external force (warp). Since the leads extend in two directions with regard to the center line of the wiring board (four directions on the wiring board), they can be designed relatively easily. In the first embodiment, the printed wiring board is multilayered; however, it need not always be done but can be formed of a single layer and in this case the same advantages can be obtained naturally.

Figure 4:
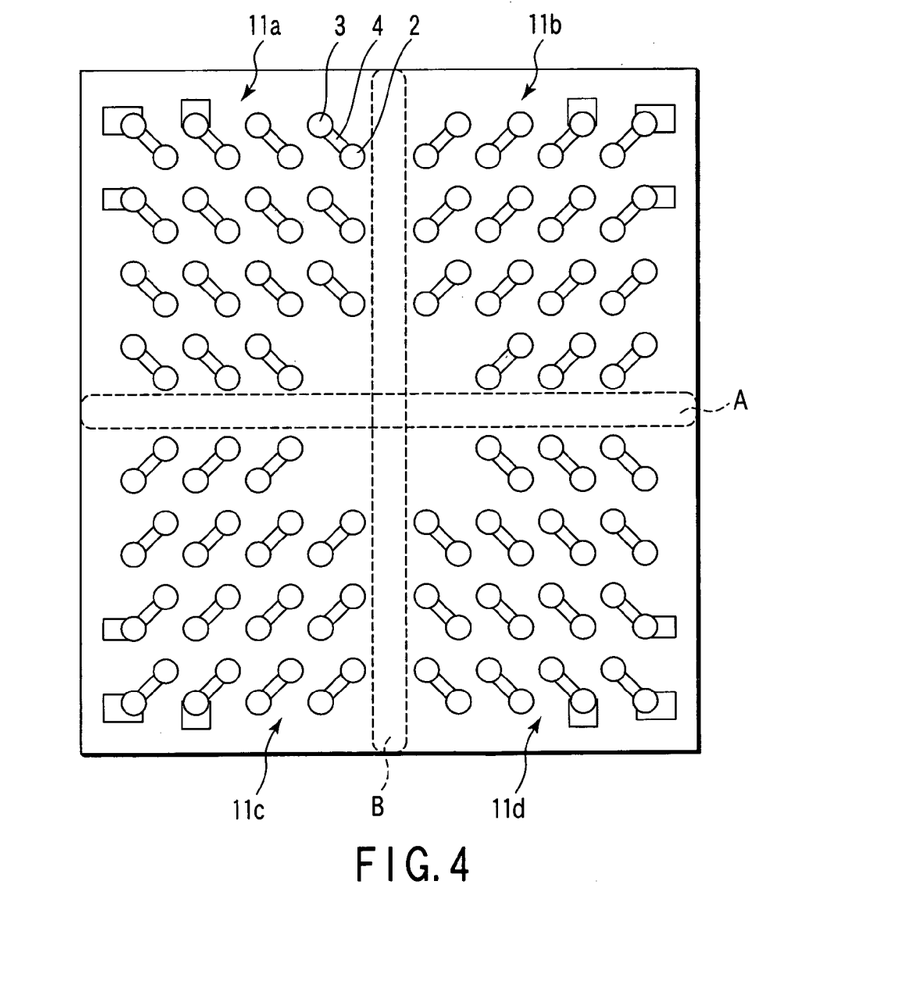
FIG. 4 is a diagram showing an example of the wiring pattern formed on the printed wiring board according to the first embodiment of the present invention.

FIG. 4 shows an example of the above-described wiring pattern (through holes 2, pads 3 and leads 4) formed on the printed wiring board.

In FIG. 4, a wiring pattern is formed on a square wiring board and divided into four pattern groups 11a to 11d. More specifically, the through holes 2 are formed at regular intervals in the wiring board (four areas) excluding the central area. The pads 3 are provided at an angle of approximately 45 degrees toward the four corners of the wiring board from the through holes 2, and the through holes 2 and pads 3 are connected by the leads 4, respectively. Incidentally, When a wiring board having a pad row that passes through the center thereof is applied, the pad row is not formed.

For example, the pattern group 11a is directed toward the upper left corner 12 of the wiring board at an angle of approximately 45 degrees (to the side 13). Similarly, the other pattern groups 11b, 11c and 11d are directed toward their respective corners at an angle of approximately 45 degrees.

If the pattern groups 11a to 11d are formed as described above, a gap (space) is formed between them. The space corresponds to an area A that is linearly formed to extend from the midpoint of one side of the rectangular (square) wiring board to that of the opposite side thereof. The space also corresponds to an area B that extends from the midpoint of one side of the board to that of the opposite side thereof and crosses the area A at right angles. In each of the pattern groups 11a to 11d shown in FIG. 4, the leads extend in the same direction. The present invention is not limited to this example. In each pattern group, some leads may extend in the direction perpendicular to that of the leads shown in FIG. 4 if their corresponding pads or through holes are not outermost ones (in this case, however, the electrodes are directed toward the outer circumference of the board).

The areas A and B are each used as a surface wiring space for the leads. If the leads are formed in these areas, they can easily be routed by the surface wiring space, thereby shortening time for designing the pattern. The leads in the areas A and B extend toward or pass through the center of the board and thus have a high durability against peeling due to a warp of the board.

If the pattern of the printed wiring board is reduced as the ball pitch of the BGA package becomes narrower than now, the pads decrease in size accordingly and become easy to peel off the printed wiring board. As measures to be taken against this, the printed wiring board according to the first embodiment of the present invention is used in which leads are not formed between the pads shown in FIG. 1 but in the areas A and B to keep the area of the pads larger than when the pattern is reduced. Thus, the first embodiment will be able to be easily applied to a future 0 narrow-pitch package.

A second embodiment of the present invention will now be described.

Figure 5:
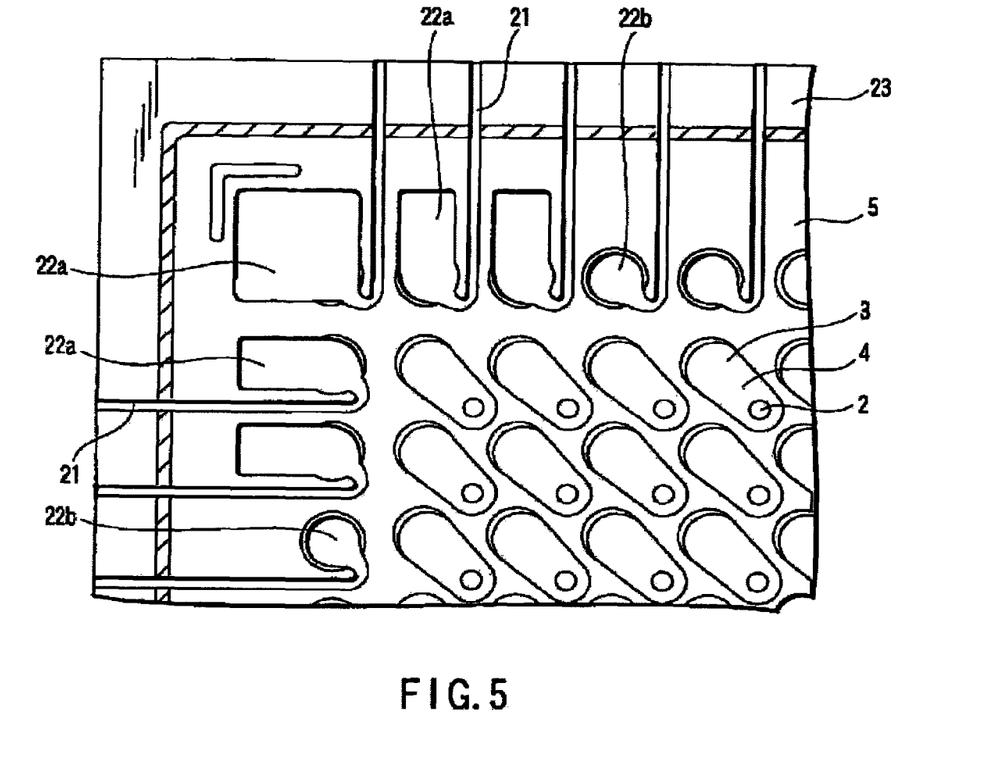
FIG. 5 is a diagram showing an example of a configuration of leads connected to the outermost pads of a printed wiring board according to a second embodiment of the present invention.

FIG. 5 shows an example of a configuration of leads connected to the outermost pads of a printed wiring board according to the second embodiment of the present invention. In FIG. 5, the same components as those of FIG. 1 are denoted by the same reference numerals and their detailed descriptions are omitted.

Referring to FIG. 5, when a lead 21 is drawn from each of pads 22a and 22b provided in the outer region 23 of a BGA package 5, it is done obliquely in an inner direction, then makes a U-turn in an outer direction and passes between the pads. The pads 22a are reinforcing pads in the corners of the wiring board. One of the pads 22a that is nearest to each of the corners has about four times as large area as a normal pad, and its adjacent two reinforcing pads 22a each have about two times as large area as a normal pad. The area of each of these pads is determined as a desirable value when they are designed.

In the second embodiment, the leads 21 are drawn toward the inside of the wiring board and elastic like a spring. Even though the leads 21 are peeled off by a warp or the like, they can be prevented from being disconnected by tension or bending.

A modification to the second embodiment of the present invention will be described below.

Figure 6:
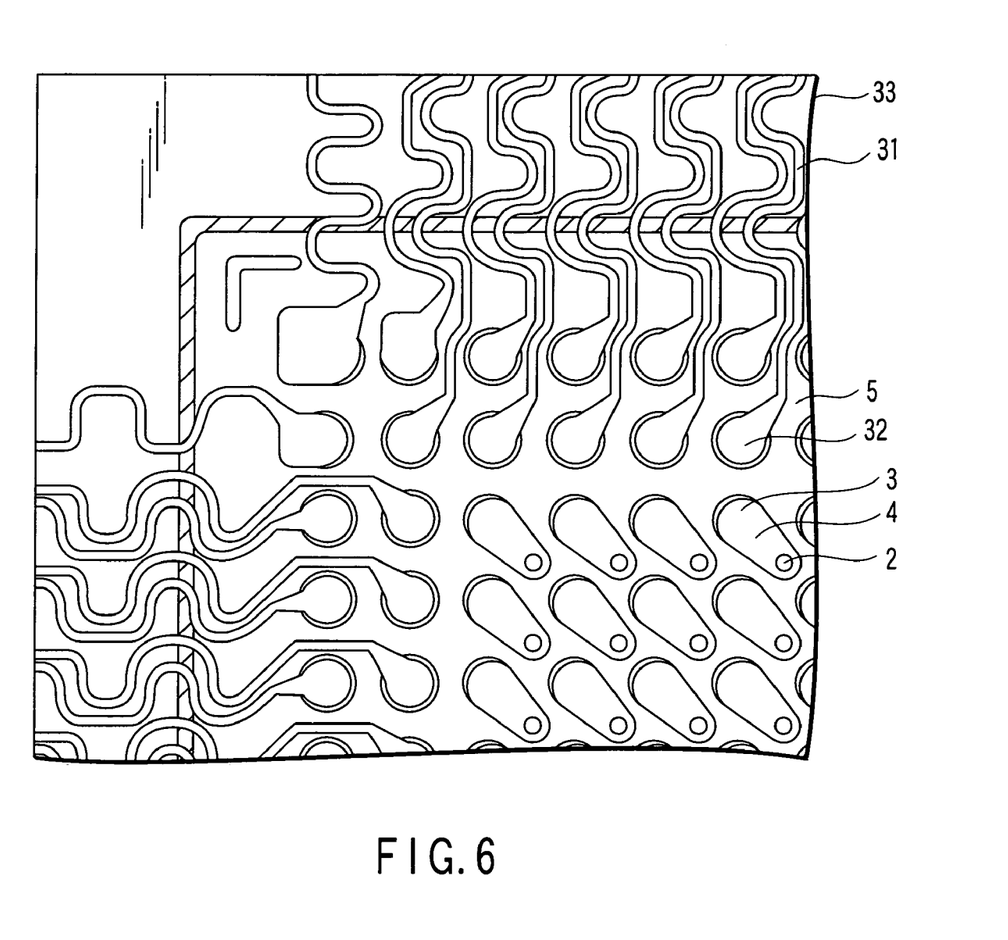
FIG. 6 is a diagram showing an example of a configuration of leads connected to the outermost pads of a printed wiring board according to a modification to the second embodiment of the present invention.

FIG. 6 shows an example of a configuration of leads connected to the outermost pads of a printed wiring board according to the modification to the second embodiment of the present invention. In this modification, leads 31 are formed meanderingly to disperse the stress applied thereto.

As shown in FIG. 6, the leads 31 drawn out of the corresponding pads 32 are gradually thinned since a great force is exerted on the portions of the leads 31 where they change in width. Since, moreover, the leads 31 are routed to cross the side 33 of the BGA package not at right angles but obliquely, they can be improved in stress dispersion and decreased in electrical disconnection.

The features of the modification that the leads vary in width and meander can be combined with the feature of the second embodiment regarding the direction in which the leads are drawn out of the pads. In the second embodiment and its modification, the pads in the corners of the wiring board can be formed as reinforcing pads the area of which is larger than that of the other pads.

As described above, the leads are shaped elastically, decreased in width gradually when they are drawn out of the pads, and routed to cross the side of the BGA package obliquely. Even though the pads are peeled off by stress, a warp or the like, the leads can be prevented from being disconnected by tension or bending since they have elasticity like a spring and receive stress from an oblique direction. If not all but one or two of the above features can be implemented on the printed wiring board, the same advantages can be obtained.

In the prior art printed wiring board, when the pads start to peel off, stress is concentrated on those portions of the leads which are connected to the pads, and the portions are often disconnected to cause an electronic device to malfunction soon. In the wiring pattern formed on the printed wiring board according to the present invention, even though the pads start to peel off, their electrical connections are maintained and there is a strong possibility of operating an electronic device normally. In other words, even though the pads are peeled off by the stress applied to the BGA package, their connections are maintained since a great stress having not only a component perpendicular to the printed wiring board but also a component parallel thereto in the direction of the center of the package is applied to the packages.

The pads usually start to peel off with their portions that are directed toward the outside of the package. In the prior art printed wiring board wherein leads are drawn out of such portions, the peeling of the pads directly affects the leads. In the present invention, however, the leads are not affected before the pads peel off completely.

Figure 7:
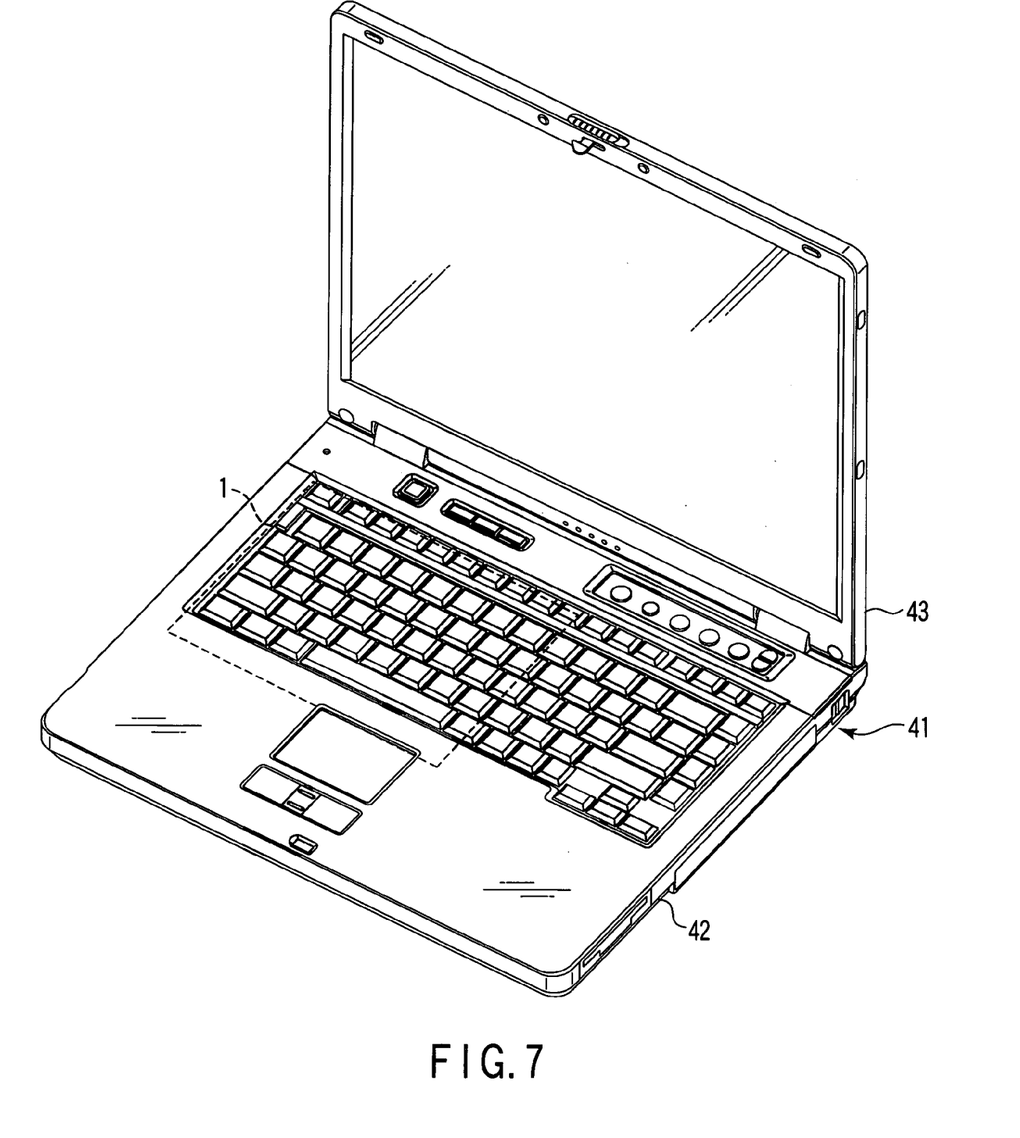
FIG. 7 is a perspective view of a notebook personal computer incorporating a printed wiring board according to the present invention.

The printed wiring board according to the present invention can be incorporated into a note PC 41 including a main body 42 and an open/close liquid crystal display 43, as shown in FIG. 7. It can be applied to portable electronic devices such as a portable device (PD), a game machine, a mobile phone and an image pickup device as well as the note PC. Needless to say, it can be incorporated into a stationary desktop PC to decrease the PC in size.

In the present invention, the angle of leads in the rectangular printed wiring board to one side of the board is approximately 45 degrees. This angle is an experimentally favorable value and thus proposed as a typical value. It is therefore not always limited to approximately 45 degrees. If the advantages can be obtained depending on the shape and materials of the printed wiring board, it does not matter if the angle falls within the range between about 30 degrees and about 60 degrees.

According to the present invention described above, there can be provided a printed wiring board having a wiring pattern whose bonding strength is high and whose design is easy to make it difficult that pads and leads peel off and to prevent the pads and leads from being disconnected electrically, and a processing device incorporating the printed wiring board.

What is claimed is:

1. A printed wiring board having a multilayer structure with a plurality of approximately rectangular wiring boards having a wiring pattern including a plurality of leads which electrically connect a plurality of electrodes, the wiring pattern comprising:

a first electrode including a plurality of pads provided on an upper layer of the approximately rectangular wiring boards;

a second electrode including a plurality of through holes formed inwardly relative to the pads and which electrically connect the plurality of approximately rectangular wiring boards;

a first lead which linearly connects the first electrode and the second electrode with almost a same width as a width or a diameter of a larger one of the first electrode and the second electrode, the first lead being formed at an angle of approximately 45 degrees to one side of the upper layer of the approximately rectangular wiring boards toward a corresponding corner thereof; and reinforcing pads provided on an outermost area of the printed wiring board, the reinforcing pads having an area greater than that of the second electrode, wherein at least one of the reinforcing pads at a corner portion of the upper layer of the approximately rectangular wiring boards is connected to the second electrode by a second lead which extends linearly, the second lead having a width which is the same as or greater than a width of the second electrode and is inclined at an angle of approximately 45 degrees with respect to the at least one of the reinforcing pads.

2. The printed wiring board according to claim 1, wherein the pads are mounted with a BGA package with solder balls interposed therebetween.

3. The printed wiring board according to claim 2, wherein a lead which is connected to outermost pads of the pads mounted with the BGA package in the wiring pattern for external electrical connection, is drawn from the pads toward an inner direction in each of the approximately rectangular wiring boards and then makes a U-turn in an outer direction.

4. The printed wiring board according to claim 3, wherein the lead is narrowed to a given width gradually from portions connected to the pads.

5. The printed wiring board according to claim 3, wherein among the outermost pads mounted with the BGA package, a pad connected to an electrode in each of four corners of the BGA package and one or two pads arranged on both sides of the pad, are increased in area more than pads other than the outermost pads.

6. The printed wiring board according to claim 2, wherein a lead which is connected to outermost pads of the pads mounted with the BGA package in the wiring pattern for external electrical connection, is routed meanderingly in an outer direction from the pads.

7. The printed wiring board according to claim 6, wherein the lead is narrowed to a given width gradually from portions connected to the pads.

8. The printed wiring board according to claim 6, wherein the lead is routed to cross a side of the mounted BGA package not at right angles but obliquely.

9. The printed wiring board according to claim 2, wherein an area of the outermost pads mounted on four corners of the BGA package is larger than that of pads other than the outermost pads.

10. The printed wiring board according to claim 1, wherein the through holes are arranged at regular intervals in each of the approximately rectangular wiring boards excluding a central area thereof, the pads are provided at an angle of approximately 45 degrees toward four corners of each of the approximately rectangular wiring boards with the through holes inwardly, and the lead is provided to connect each of the pads and each of the through holes linearly and divided into first to fourth pattern groups in which the lead is formed at an angle of approximately 45 degrees to one side of each of the approximately rectangular wiring boards toward four corners of each of the approximately rectangular wiring boards, leads of the first to fourth pattern groups are formed at an angle of approximately 45 degrees toward the four corners of each of the approximately rectangular wiring boards, and a first area is formed between the first to fourth pattern groups to extend linearly from a midpoint of one side of each of the approximately rectangular wiring boards to that of an opposite side thereof through a center of the printed wiring board, and a second area is formed to cross the first area at right angles.

11. The printed wiring board according to claim 10, wherein the first area and the second area are areas in which leads are formed to extend outside the printed wiring board.

12. The printed wiring board according to claim 10, wherein the leads of the first to fourth pattern groups include leads which extend at an angle of approximately 45 degrees toward the four corners of the wiring board and leads which extends to cross the leads at right angles.

13. The printed wiring board according to claim 1, wherein the reinforcing pads are provided on four corners of the printed wiring board and along four sides of the printed wiring board, the reinforcing pads provided on four corners of the printed wiring board having an area greater than that of an area of the other ones of the reinforcing pads arranged along four sides of the printed wiring board.

14. An information processing device including a printed wiring board having a multilayer structure with a plurality of approximately rectangular wiring boards having a wiring pattern including a plurality of electrodes and a plurality of leads which electrically connects the electrodes, the wiring pattern comprising:

a first electrode including a plurality of pads provided on an upper layer of the approximately rectangular wiring boards;

a second electrode including a plurality of through holes formed inwardly relative to the pads and which electrically connect the plurality of approximately rectangular wiring boards;

a first lead which linearly connects the first electrode and the second electrode with almost a same width as a width or a diameter of a larger one of the first electrode and the second electrode, the first lead being formed at an angle of approximately 45 degrees to one side of the upper layer of the approximately rectangular wiring boards toward a corresponding corner thereof; and reinforcing pads provided on an outermost area of the printed wiring board, the reinforcing pads having an area greater than that of the second electrode, wherein at least one of the reinforcing pads at a corner portion of the upper layer of the approximately rectangular wiring boards is connected to the second electrode by a second lead which extends linearly, the second lead having a width which is the same as or greater than a width of the second electrode and is inclined at an angle of approximately 45 degrees with respect to the at least one of the reinforcing pads.

15. The information processing device according to claim 14, wherein the reinforcing pads are provided on four corners of the printed wiring board and along four sides of the printed wiring board, the reinforcing pads provided on four corners of the printed wiring board having an area greater than that of an area of the other ones of the reinforcing pads arranged along four sides of the printed wiring board.

* * * * *